(12) United States Patent
Grinevich et al.

(10) Patent No.: US 6,309,797 B1
(45) Date of Patent: Oct. 30, 2001

(54) SELECTIVELY COLORABLE POLYMERIZABLE COMPOSITIONS

(75) Inventors: Oleg V. Grinevich; John H. Malpert; Alexandre Mejiritski, all of Bowling Green; Douglas C. Neckers, Perrysburg, all of OH (US)

(73) Assignee: Spectra Group Limited, Inc., Maumee, OH (US)

( * ) Notice: Subject to any disclaimer, the term of this patent is extended or adjusted under 35 U.S.C. 154(b) by 0 days.

(21) Appl. No.: 09/558,599

(22) Filed: Apr. 26, 2000

(51) Int. Cl.[7] ............... G03C 7/00; G03C 1/73; G03F 7/027; G03F 7/038; G03F 7/26

(52) U.S. Cl. .......... 430/293; 430/339; 430/338; 430/342; 430/341; 430/344; 430/333; 430/280.1; 430/270.1; 430/285.1; 430/281.1; 430/286.1; 430/287.1

(58) Field of Search .............. 430/293, 339, 430/338, 342, 341, 344, 333, 280.1, 270.1, 285.1, 281.1, 286.1, 287.1

(56) References Cited

U.S. PATENT DOCUMENTS

| | | | |
|---|---|---|---|
| 4,659,649 | 4/1987 | Dickinson et al. | 430/280.1 |
| 4,780,393 | * 10/1988 | Frommeld | 430/293 |
| 4,859,572 | 8/1989 | Farid et al. | 430/281.1 |
| 4,962,011 | 10/1990 | Aldag et al. | 430/281.1 |
| 5,441,850 | 8/1995 | Marshall et al. | 430/336 |
| 5,453,345 | 9/1995 | Grasshoff et al. | 430/270.1 |
| 5,677,107 | * 10/1997 | Neckers | 430/281.1 |
| 5,942,554 | 8/1999 | Ren et al. | 522/25 |
| 5,983,065 | * 11/1999 | Folkins et al. | 399/366 |

FOREIGN PATENT DOCUMENTS

| | | |
|---|---|---|
| WO 97/09168 | 3/1997 | (WO) . |
| WO 00/07071 | 2/2000 | (WO) . |

* cited by examiner

*Primary Examiner*—Cynthia Hamilton
(74) *Attorney, Agent, or Firm*—Thompson Hine LLP

(57) ABSTRACT

Selectively colorable polymerizable compositions and a method for forming selectively colored polymeric bodies using such compositions are disclosed. In accordance with the invention, a selectively colorable polymerizable composition comprising both a leucobase color former and a leuconitrile color former is irradiated with light of a particular wavelength and specific intensity for a specified duration. Exposure to actinic radiation cures the composition and activates the color formers. The irradiation dosage can be varied to selectively color the polymeric body whereby the resultant color of any particular area depends on the exposure dose received at that location. By varying the dose, a polymeric body can be prepared having distinctly colored elements at specific locations.

28 Claims, No Drawings

SELECTIVELY COLORABLE POLYMERIZABLE COMPOSITIONS

BACKGROUND OF THE INVENTION

The present invention relates to selectively colorable polymerizable compositions and to a method for forming selectively colored polymeric bodies using such compositions.

A selectively colorable solid object is an object that can be colored at small individual, but specifically defined, sites by irradiating light of a particular wavelength and specific intensity for a specified duration. The light sources capable of producing the selectively colorable solid object include: (a) a laser interfaced with an XY scanner (for polymer films), (b) a laser interfaced with an XYZ scanner (for 3D parts), (c) digital mirror device, (d) UV and Visible lamps with a masking device, etc.

A selectively colorable resin (SCR) system consists of: (a) the matrix (a blend of polymerizable material or a solid polymer), (b) a color former, (c) a color initiator (species that generate other species capable of reacting with color former; may not be needed in some systems); and (d) a chain reaction initiator (radical or cationic or none depending on the system).

The conventional method for forming a colored plastic body is to add a dye or pigment to the liquid prepolymer composition. The composition is then cured with actinic radiation. The latter requires that the absorption spectra of the photoinitiator and the dye/pigment differ. If the dye/pigment absorbs actinic radiation at the same wavelength as the photoinitiator, slower or no cure will be achieved. The color formation method is also not selective. The entire plastic is uniformly colored. Still another problem is that the photopolymerization process requires actinic radiation, but the color forming process requires only that the composition be well mixed. Though one of the processes can be controlled by the intensity/wavelength of the actinic radiation, the other is unaffected by it. Thus there is no selectivity of color formation in the plastic body.

Accordingly, there is a need for selectively colorable polymerizable compositions and for a method of forming selectively colored polymeric bodies using such compositions wherein the colorization process can be controlled as to the location and intensity of the color formed.

SUMMARY OF THE INVENTION

The present invention discloses selectively colorable polymerizable compositions and a method for forming selectively colored polymeric bodies using such compositions. In accordance with the invention, a selectively colorable polymerizable composition comprising both a leucobase color former and a leuconitrile color former is irradiated with light of a particular wavelength and specific intensity for a specified duration. Exposure to actinic radiation cures the composition and activates the color formers. The irradiation dosage can be varied to selectively color the polymeric body whereby the resultant color of any particular area depends on the exposure dose received at that location. By varying the dose, a polymeric body can be prepared having distinctly colored elements at specific locations.

It is believed that, upon irradiation of the polymerizable composition of the present invention containing a polymerizable compound, a leuconitrile color former, a leucobase color former and an onium salt, a number of interacting mechanisms occur for color formation. One mechanism is the generation of a first dye cation upon exposure of a leucobase dye precursor in the presence of an oxidizing agent and a second mechanism is the generation of a second dye cation and a leaving group by heterolysis of a leuconitrile color former. Upon further exposure a third mechanism occurs whereby the first dye cation is bleached in the presence of the second color former. At still higher doses of irradiation the first and second dye cations are both bleached. Accordingly, the composition of the present invention provides a photopolymerizable selectively colorable polychromic system.

In one embodiment of the present invention, a composition is provided which can be exposed to different levels of irradiation to produce a selectively colored polymeric body. Under low dosage, color formation depends primarily on Scheme 1 wherein exposure of a leucobase to light in the presence of a oxidizing agent yields a first dye cation of a first color. The mechanism is illustrated below for a triarylmethane (TAM) leucobase (TAMH) susceptible to oxidation. Ox represents an oxidizing agent and $TAM^+$ represents the colored species. It is anticipated that the scheme below will also be valid for diarylmethane (DAM) leucodyes (DAMH and DAMCN).

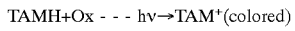
$$TAMH + Ox \text{ - - - } h\nu \rightarrow TAM^+ (colored) \quad \text{Scheme 1}$$

The other mechanism is the heterolysis of a second color former which yields a second dye cation and a leaving group. This mechanism is illustrated below for a triarylmethane leuconitrile (TAM-CN) color former. TAM-CN is susceptible to photochemical heterolysis and forms a colored species through the heterolytic cleavage of the C—CN bond. Accordingly, mechanism 2 also yields a leaving group (CN) upon heterolysis of the leuconitrile color former.

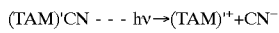
$$(TAM)'CN \text{ - - - } h\nu \rightarrow (TAM)'^+ + CN^- \quad \text{Scheme 2}$$

Preferably, the reactants are selected such that mechanism 1 is much faster than mechanism 2 at high concentrations of the oxidizing agent (Ox). Thus, at low doses of actinic exposure the color is primarily determined by $TAM^+$. To increase the color contrast, the leucobase and leuconitrile color formers can be selected such that the dye cation derived from the leucobase ($TAM^+$) is less stable than the dye cation derived from the leuconitrile ($(TAM)'^+$). Accordingly, at higher doses of irradiation, bleaching of the less stable $TAM^+$ occurs while the amount of color formed by $(TAM)'^+$ increases. Therefore, the color of the polymeric body at higher doses of irradiation is primarily determined by the $(TAM)'^+$ cation.

In another embodiment of the present invention, a polychromic polymeric body is produced by increasing the irradiation dose to cause bleaching of both colored dye cations. In accordance with this embodiment, the dye cation formed from heterolysis of the leuconitrile color former is bleachable at high doses of actinic radiation. Therefore, a selectively colorable, polychromic composition is obtained wherein low light exposure creates a polymer of one color, intermediate light exposure changes the color of the polymer and a high dosage of light exposure bleaches the color of the polymer.

DETAILED DESCRIPTION OF THE INVENTION

In accordance with the present invention, a composition which can be selectively colored by exposure to actinic radiation and a method leading to the formation of selectively colored, polychromic, polymer bodies that can be cured photochemically are provided. The invention is particularly useful for the selective color development and photopolymerization of films using a leucobase color former, a leuconitrile color former and an oxidizing agent. The composition of the present invention can be used in a solid or a liquid.

Those skilled in the art will appreciate that the color determinative irradiation step can be conducted before, after or simultaneously with the polymerization or crosslinking step. Furthermore, selective coloration of a polymeric body in accordance with the present invention can be carried out using one exposure or light source to polymerize or crosslink the composition and a second exposure or light source to induce the photochromic response, or using a single light source to polymerize the composition at a first intensity and using the same light source at a plurality of intensities to induce the photochromic response. The latter system has the advantage that it involves the use of only one light source and it will be appreciated that this system is easily implemented using highly sensitive photohardenable systems, which can be easily polymerized using a lower intensity light exposure. As a general rule, agents, such as photoinitiators, used to initiate polymerization will be more efficient than the photoresponsive agents described below so more or different energy will be required to color the selectively colorable composition than to form the polymeric film or body and colorization will be induced at higher intensities than polymerization.

The present invention involves the interaction of two different color formers to generate a photosensitive, polychromic composition. The first color former yields a first dye cation of a first color upon actinic exposure in the presence of an oxidizing agent. The second color former undergoes heterolysis upon actinic exposure to yield a second dye cation of a second color and a leaving group.

Examples of color formers which yield a colored cation upon exposure to actinic radiation in the presence of an oxidizing agent include thiazine, oxazine and phenazine leuco dyes as well as triarylmethane leuco dyes (TAM-X), diarylmethane leuco dyes (DAM-X) and monoarylmethane leuco dyes (Ar—CR$_2$X) wherein X is H, OH, OR, NR$_2$, N-heterocycle, and R is hydrogen, alkyl, aryl or aralkyl and the like. Preferably, the color former is a triarylmethane or diarylmethane leuco base susceptible to oxidation, with triarylmethane leuco base (TAM-H) being the most preferred color former.

Examples of triarylmethane based color formers include tris(4-(N,N-dimethylamino)phenyl)methane (Leuco Crystal Violet), bis(4-(N,N-dimethylamino)phenyl)phenylmethane (Leuco Malachite Green), tris(4-aminophenyl)methane (Leuco Basic Fuchsin), bis(4-(N,N-dimethylamino)phenyl) pentafluorophenylmethane, bis(4-(N,N-dimethylamino) phenyl)-2-fluorophenylmethane, bis(4-(N,N-dimethylamino)phenyl)-3-fluorophenylmethane, bis(4-(N,N-dimethylamino)phenyl)-2,6-difluorophenylmethane, bis(3-(2-methylindyl))phenylmethane, Benzoyl Leucomethylene Blue and the like.

Examples of diarylmethane based color formers include bis(4-aminophenyl)methane, bis(4-(N,N-dimethylamino) phenyl)methane, bis(4-amino-3,5-dimethylphenyl)methane, bis(4-amino-3-chlorophenyl)methane, bis(4-amino-2-chloro-3,5-diethylphenyl)methane, bis(4-aminophenyl) methane, 4-aminophenyl-(4-amino-3-bromophenyl) methane and the like.

The second type of color formers useful in the present invention include those which form color primarily through heterolysis to generate a dye cation and a leaving group (L). Suitable color formers of this type are, for example, triarylmethane leuco dyes (TAM'-L), diarylmethane leuco dyes (DAM'-L) and monoarylmethane leuco dyes (Ar'—CR$_2$L) wherein L is a leaving group such as CN, SO$_2$, $P(O)OR2$, or CH$_2$-heterocycle, etc. Irradiation of these color formers causes heterolysis with dye formation and release of the leaving group moiety. Examples of preferred color formers susceptible to photochemical heterolysis include triarylmethane leuconitriles such as tris(4-(N,N-dimethylamino) phenyl)cyanomethane (Crystal Violet Leuconitrile), bis(4-(N,N-dimethylamino)phenyl)(phenyl)cyanomethane (Malachite Green Leuconitrile), tris(4-aminophenyl) cyanomethane (Basic Fuchsin Leuconitrile), bis(4-N,N-dimethylamino)phenyl)(pentafluorophenyl) cyanomethane, bis(4-(N,N-dimethylamino)phenyl)-(2-fluorophenyl) cyanomethane, bis(4-(N,N-dimethylamino)phenyl)-(3-fluorophenyl)cyanomethane, bis(4-(N,N-dimethylamino) phenyl)-(2,6-difluorophenyl)cyanomethane, bis(3-(2-methylindyl))phenyl)cyanomethane, bis(4-aminophenyl)-(4-amino-3-methyphenyl)cyanomethane (Unsymmetric Basic Fuchsin Leuconitrile), tris[4-(N-triphenylmethyl) aminophenyl]cyanomethane(Protected Basic Fuchsin Leuconitrile), bis(4-(N,N-diethylamino)phenyl)(1-[4-(N-ethylamino)naphthyl])cyanomethane (Victoria Pure Blue Leuconitrile) and the like. The dye cation generated by the first color former will typically have fewer auxochromic groups in the ortho and para positions than the dye cation formed by the second color former. The reason for this is that auxochromic groups provide more stability to the cationic species. Examples of auxochromic groups are NH$_2$, NR$_2$, OH, OR, where R is a hydrocarbon.

Oxidizing agents useful in the present invention include molecular oxygen or compounds which generate an oxidizing agent which, in turn, oxidizes the leuco dye and generates the colored carbocation. Typical photosensitive oxidizing agents include onium salts such as iodonium, sulfonium and the like, transition metals, iron salts, uranyl salts, etc. used in the absence or presence of an oxidizing species such as hydrogen peroxide. The oxidizing agent, to oxidize the leucodye, will have a photoreduction potential less than the first color former.

Onium salts such as sulfonium or iodonium salts are particularly preferred for use as oxidizing agents in the invention. It is believed that upon photochemical or thermal decomposition, an iodonium salt generates radicals and cations, either or both of which can be used to initiate polymerization, while oxidizing the color precursor which converts the color precursor into its colored form.

Self-coloring photohardenable compositions in accordance with the present invention in their simplest form include a curable compound, an onium salt and at least two color precursors. In some cases, the compositions may also include a hydrogen donor, although not essential in the principal embodiments, and for many applications it will also be desirable to include a photoinitiator in the composition.

While triarylsulfonium salts such as triarylsulfonium hexafluoroantimonate or mixtures of triarylsulfonium hexafluoroantimonates and the like are preferred onium salts, other sulfonium salts and iodonium salts are also suitable for use in the invention. Decomposition of triarylsulfonium hexafluoroantimonate can be achieved photochemically. Examples of onium salts useful in the present invention include iodonium salts and sulfonium salts and, more particularly, diaryliodonium hexaflurophosphates, diaryliodonium arsenates and diaryliodonium antimonates. The counter ion of the onium salts is usually a nonnucleophilic semimetal complex such as $B(C_6F_5)_4^-$, $Al(C_6F_5)_4^-$, $Ga(C_6F_5)_4^-$, $In(C_6F_5)_4^-$, $Th(C_6F_5)_4^-$, $SbF_6^-$, $AsF_6^-$, $PF_6^-$ and $BF_4^-$. A more complete list of iodonium salts appears in published International Application PCT/US/95/05613. Representative examples of iodonium salts include salts having the following structures: $C_nH_{2n+1}C_6H_4I^+(C_6H_5)$, $(C_nH_{2n+1}C_6H_4)_2I^{30}$, $(C_nH_{2n+1}OC_6H_4)I^+(C_6H_5)$ and $(C_nH_{2n+1}OC_6H_4)_2I^+$ were n is preferably 1 to 12 and typically 8 to 12 and most preferably, the diaryliodonium salts such as 4,4'-dimethyldiphenyliodonium tetrafluoroborate and (4-octyloxyphenyl) phenyliodonium hexafluoroantimonate (OPPI). Representative examples of sulfonium salts include triarylsulfonium hexafluoroantimonate, triarylsulfonium hexafluorophosphate, triarylsulfonium tetra(perfluoro) phenylgallate, tetra(perfluoro)phenylborate and the like.

Because decomposition of the onium salt is accompanied by the generation of free radicals and cations, the curable material may be a free radical curable or a cation curable material or a blend of the two. There is a large number of monomers which can be polymerized by cations. These monomers can be classified according to their functionality. They include cyclic ethers, cyclic formals and acetals, vinyl ethers, and epoxy compounds. These monomers can be monofunctional, difunctional and multifunctional. They may also be large molecular weight prepolymers and oligomers. Examples of cationically polymerizable compounds include epoxy compounds, vinyl or allyl monomers, vinyl or allylic prepolymers, vinyl ethers, vinyl ether functional prepolymers, cyclic ethers, cyclic esters, cyclic sulfides, melamineformaldehyde prepolymers, phenol formaldehyde prepolymers, cyclic organosiloxanes, lactans and lactones, cyclic acetals and epoxy functional silicone oligomers.

Epoxy monomers are the most important class of cationic polymerizable substrates. These materials are readily available and the resulting cured polymers possess excellent dimensional and thermal stability as well as superior mechanical strength and chemical resistance. They are widely used in the coating, painting and adhesives industry. Examples of cationically polymerizable epoxy compounds described in the literature include any monomeric, dimeric or oligomeric or polymeric epoxy material containing one or a plurality of epoxy functional groups. Examples of polymerizable epoxy compounds include bisphenol-A-diglycidyl ether, trimethylene oxide, 1,3-dioxolane, 3,4-epoxycyclohexylmethyl-3',4'-epoxycyclohexyl carboxylate, phenyl glycidyl ether, 4-vinylcyclohexene dioxide, limonene dioxide, cycloaliphatic epoxides such as 1,2-cyclohexene oxide, epichlorohydrin, glycidyl acrylate, glycidyl methacrylate, styrene oxide, allyl glycidyl ether, etc. Resins which result from the reaction of bisphenol A (4,4-isopropylidenediphenol) and epichlorohydrin, or from the reaction of low molecular weight phenol-formaldehyde resins (Novolak resins) with epichlorohydrin have been used alone or in combination with an epoxy containing compound. In addition, polymerizable epoxy compounds include polymeric materials containing terminal or pendant epoxy groups. Examples of these compounds are vinyl copolymers containing glycidyl acrylate or methacrylate as one of the comonomers. Other classes of epoxy containing polymers amenable to cure have also been described in the literature and include epoxy-siloxane resins, epoxy-polyurethanes and epoxy-polyesters. Such polymers usually have epoxy functional groups at the ends of their chains. Epoxy-siloxane resins and the method for making them are more particularly shown by E. P. Plueddemann and G. Ganger, J. Am. Chem. Soc. 81 632–5 (1959), and in Crivello et al., Proceeding ACS, PMSE, 60, 217 (1989). As described in the literature, epoxy resins can also be modified in a number of standard ways such as reactions with amines, carboxylic acids, thiols, phenols, alcohols, etc. as shown in U.S. Pat. Nos. 2,935,488; 3,235,620; 3,369,055; 3,379,653; 3,398,211; 3,403,199; 3,563,850; 3,567,797; 3,677,995, etc. Further examples of epoxy resins are shown in the Encyclopedia of Polymer Science and Technology, Vol. 6, 1967, Interscience Publishers, New York, pp. 209–271.

Examples of vinyl or allyl organic monomers which have been used in the literature in the practice of the cationic polymerization include, for example, styrene, vinyl acetamide, methyl styrene, isobutyl vinyl ether, n-octyl vinylether, acrolein, 1,1-diphenylethylene. R-pinene; vinyl arenes such as 4-vinyl biphenyl, 1-vinyl pyrene, 2-vinyl fluorene, acenapthylene, 1 and 2-vinyl napthylene; 9-vinyl carbazole, vinyl pyrrolidone, 3-methyl-1-butene; vinyl cycloaliphatics such as vinylcyclohexane, vinylcyclopropane, 1-phenyvinylcyclopropane; dienes such as isobutylene, isoprene, butadiene, 1,4-pentadiene, 2-chloroethyl vinyl ether, etc. Some of the vinyl organic prepolymers which have been described are, for example, $CH_2=CH-O-(CH_2O)n-CH=CH_2$, where n is a positive integer having a value up to about 1000 or higher; multi-functional vinylethers, such as 1,2,3-propane trivinyl ether, trimetheylolpropane trivinyl ether, polyethyleneglycol divinylether (PEGDVE), triethyleneglycol divinyl ether (TEGDVE), vinyl ether-polyurethane, vinyl ether-epoxy, vinyl ether-polyester, vinyl ether-polyether and other vinyl ether prepolymers such as 1,4-cyclohexane dimethanol-divinylether, commercially available from GAF and others, and low molecular weight polybutadiene having a viscosity of from 200 to 10,000 centipoises at 25° C., etc.

A further category of cationically polymerizable materials are cyclic ethers which are convertible to thermoplastics. Included by such cyclic ethers are, for example, oxetanes such as 3,3-bis-chloromethyloxetane alkoxyoxetanes as shown by U.S. Pat. No. 3,673,216; oxolanes such as tetrahydrofuran, oxepanes, oxygen containing spiro compounds, trioxane, dioxolane, etc. In addition to cyclic ethers, there are also included cyclic esters such as lactones, for example, propiolactone, cyclic amines, such as 1,3,3-trimethylazetidine and cyclic organosiloxanes, for example. Examples of cyclic organosiloxanes include hexamethyl trisiloxane, octamethyl tetrasiloxane, etc. Cyclic acetals may also be used as the cationic polymerizable material. Examples of epoxy functional silicone oligomers are commercially available from General Electric and are described in ACS PMSE Proceeding 1989, Vol. 60, pp. 217, 222.

Because the photoinitiator generates both free radicals and cations, it is possible to utilize a combination of free radical polymerizable and cationic polymerizable monomers. Examples of free radical polymerizable monomers include both monomers having one or more ethylenically unsaturated groups, such as vinyl or allyl groups, and polymers having terminal or pendant ethylenic unsaturation. Such compounds are well known in the art and include acrylic and methacrylic esters of polyhydric alcohols such as trimethylolpropane, pentaerythritol and the like, and acrylate or methacrylate terminated epoxy resins, acrylate or methacrylate terminated polyesters, etc. Representative examples include ethylene glycol diacrylate, ethylene glycol dimethacrylate, trimethylolpropane triacrylate (TMPTA), pentaerythritol tetraacrylate, pentaerythritol tetramethacrylate, dipentaerythritol hydroxypentacrylate (DPHPA), hexanediol-1,6-dimethacrylate, and diethyleneglycol dimethacrylate.

Examples of materials which are both cationically and free radically cured include glycidyl methacrylates, epoxy acrylates, acrylated melamine formaldehyde and epoxidized siloxanes. The simultaneous utilization of a cationically and free radical curable system enables rapid curing to be accomplished and provides a wide latitude in the design of product performance. For example, when a solution of acrylate and epoxy acrylate is used as the dual curable composition, film properties ranging from flexible to rigid can be produced and desired adhesive characteristics can be produced by selection of designed ratios of functional groups. The epoxy functionality provides high temperature resistance, excellent adhesion and reduced oxygen sensitivity whereas the acrylate functionality provides rapid curing speed, excellent weatherability, flexibility and desirable viscosity. Other examples of dual curable systems will be envisioned and appreciated by those skilled in the art. It has been found that a mixture of an acrylate and an epoxy compound is particularly desirable for use herein.

In accordance with one embodiment of the present invention, a photoinitiator is included in the self coloring photohardenable composition. Some typical examples of photoinitiators which are expected to be useful in the present invention are α-alkoxy phenyl ketones, O-acylated-α-oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, haloalkanes, α-halo-α-phenylacetophenones, halogenated paraffins (e.g., brominated or chlorinated paraffin) and benzoin alkyl ethers. A wide range of xanthene or fluorone dyes may be used as photoinitiators in accordance with the invention. Some examples include Methylene Blue, rhodamnine B, Rose Bengal, 3-hydroxy-2,4,5,7-tetraiodo-6-fluorone,5,7-diiodo-3-butoxy-6-fluorone, erythrosin B, Eosin B, ethyl erythrosin, Acridine Orange, 6'-acetyl-4,5,6,7-tetrachloro-2'4'5',6',7'-tetraiodofluorescein (RBAX), and the fluorones disclosed in U.S. Pat. No. 5,451,343.

For some applications it may be desirable to include a hydrogen donor in the compositions of the invention. Useful hydrogen donors can be selected from among those known in the art and, more particularly, from known hydrogen donating coinitiators. Non-nucleophilic amines such as aromatic amines of low basicity are particularly useful in the invention. The relative efficiency of the hydrogen donor in cationic polymerization not only depends on the efficiency of radical generation, but also on the efficiency of the oxidation of the radicals to cations as well as on the efficiency of the cation to initiate the cationic polymerization. The hydrogen donor must have a low basicity and low nucleophilicity. If the hydrogen donor is too basic, it will deactivate the cationic center responsible for initiation. Only aromatic amines with α hydrogens are capable of initiating ring opening polymerization of cyclohexene oxide. Aliphatic amines, aromatic amines without α hydrogens and non-amine hydrogen donors are incapable of the initiation with cyclohexene oxide.

Representative examples of N,N-dialkylanilines useful in the present invention are 4-cyano-N N-dimethylaniline, 4-acetyl-N,N-dimethylaniline, 4-bromo-N,N-dimethylaniline, 4-methyl-N,N-dimethylaniline, 4-ethoxy-N,N-dimethylaniline, N,N-dimethylthioanicidine, 4-amino-N,N-dimethylaniline, 3-hydroxy-N,N-dimethylaniline, N,N,N'N'-tetramethyl-1,4-dianiline, 4-acetamido-N,N-dimethylaniline, 2,6-diethyl-N,N-dimethylaniline, N,N,2,4,6-pentamethylaniline(PMA) p-t-butyl-N,N-dimethylaniline and N,N-dimethyl-2,6-diisopropyl aniline. Also useful as hydrogen donors are N-phenylglycine and N,N-dimethyltoluidine. However, the invention is not limited to the use of amines or aromatic amines as hydrogen donors. Other compounds present in the composition may be capable of functioning as a hydrogen donor. For example, many monomers are capable of acting as hydrogen donors and compositions containing these compounds may be used effectively with or without amines. A specific example of such monomer are certain cycloaliphatic epoxides.

Solvents may be necessary to dissolve components of the system including the photoinitiator, the color precursor, etc., if they are not sufficiently soluble in the monomer. Some examples of useful solvents are ethyl acetate, etc. Other useful solvents can be identified readily.

The nature of the monomer or polymerizable material, the amount of the color precursor and onium salt in curable self-coloring compositions in accordance with the present invention will vary with the particular use of the compositions, the emission characteristics of the exposure sources, the development procedures, the physical properties desired in the polymerized product and other factors. With this understanding, compositions in accordance with the invention will generally fall within the following compositional ranges in parts by weight (based on 100 parts total).

| Curable compound | 60 to 99 |
| Color Precursors | 0.001 to 1 |
| Photoinitiator | 0 to 10 |
| Onium Salt | 0.05 to 15 |

Compositions in accordance with the invention more typically are anticipated to have the following formulation:

| Curable compound | 85 to 98 |
| Color Precursors | 0.02 to 0.2 |
| Photoinitiator | 0.5 to 5.0 |
| Onium Salt | 0.1 to 1.0 |

Preferably, the color formers are present in an amount sufficient to provide a contrast ratio of at least 1.5, more preferably at least 3. The term "contrast ratio" means the ratio of absorbance maximum values at two doses. These doses are the largest dose and the dose at which the polymer is formed unless specified otherwise. As used herein contrast ratio refers to the absorbance of the colored polymeric film or body at the high irradiation dose divided by the absorbance at the low dose at the specified wavelength. Contrast ratio is a function of a number of variables including, but not limited to, the light source, irradiation dosage, curable compound, photoinitiator and color formers.

The number of color formers, type of color formers, the concentration of the color formers, the interaction between the different color formers and the relative concentrations of the color formers influence the contrast ratio. Typically, the color formers are present in a ratio (leucobase to leuconitrile by weight) of from about 0.1 to 20, preferably from about 1 to 10.

The compositions of the present invention are useful in the following applications: creating color contrast in printing plates such as in flexographic plates, other proofing and identification purposes, end of line manufacturing identification, fraud protection, selective imagewise colorization of a wire or other plastic objects, color printing of relief and 3D images with various light sources, and the like. The photohardenable composition of the invention may also be advantageous for use in the three dimensional modeling process taught in U.S. Pat. No. 4,575,330 to Hull and commonly assigned U.S. Pat. No. 5,514,519, the latter being hereby incorporated by reference.

Irradiation of resins consisting of monomers, preferably acrylates or epoxides and most preferably a mixture of acrylates and epoxides, a leuconitrile color precursor, a leucobase color former and a sulfonium salt can result in selectively colored films in which the polymerization process and the color formation occur simultaneously. Alternatively, the polymerization process can be conducted prior to or after the color formation.

In a preferred embodiment of the present invention, a photopolymerizable composition comprising a cationically polymerizable epoxide, a triarylsulfonium salt photoinitiator, an acrylate and a free radical photoinitiator is polymerized in the presence of both a triarylmethane leucobase color former (TAMH) and a triaryhnethane leuconitrile color former ((TAM)'CN). Color formation proceeds according to the following mechanisms:

Mechanism 1: TAMH+Ox - - - hv→TAM⁺

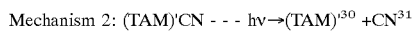
Mechanism 2: (TAM)'CN - - - hv→(TAM)'³⁰ +CN³¹

Preferably, mechanism 1 is much faster than mechanism 2 at high concentrations of oxidizing agent (Ox) such that at low doses of irradiation the color is primarily determined by TAM⁺. Furthermore, the colored cation generated by the oxidation of the leucobase color former (TAM⁺) preferably is less stable than the colored cation generated by the heterolysis of the leuconitrile color former ((TAM)'³⁰ ). Accordingly, upon further irradiation the less stable TAM⁺ cation is bleached. Although not wishing to be bound by theory, applicants believe that the bleaching effect could be the result of the less stable TAM⁺ trapping the cyanide moiety released during the heterolysis of (TAM)'CN. Reaction of the cyanide moiety shifts the leuconitrile heterolysis equilibrium to the right and increases the production of TAM'⁺ and consequently, increases the amount of color formed by TAM'⁺. Therefore, at higher doses of irradiation the color of the polymeric body depends primarily on the TAM'⁺ cation.

In another embodiment of the present invention, a composition is provided which can be selectively colored by exposure to actinic radiation which comprises a first color former which yields a first dye cation upon exposure in the presence of an oxidizing agent and a second color former which yields a second dye cation and a leaving group by heterolysis, wherein the first and second dye cations are bleached by further radiation. In accordance with this embodiment, the irradiation dosage can be varied to produce a selectively colorable polychromic composition. Accordingly, the photocurable composition can be irradiated in selected areas to produce lightly colored polymer by exposure to a low dosage, highly colored or different colored polymer by exposure to an intermediate light dosage and bleached polymer by exposure to a high dosage of actinic radiation. The bleaching leuconitrile effect which characterizes this embodiment is typically observed in slightly polar solvents and certain hybrid resins.

EXAMPLE 1

A selectively colorable photocurable composition can be prepared by including both a TAM-H color former and a TAM'-CN color former in a resin called Resin 1 containing cationically polymerizable epoxide(s) (60–90%), triarylsulfonium hexafluoroantimonate photoinitiator(s) (0.5–8%), acrylate esters (5–35%), free radical photoinitiator(s) (0.5–5.0%). Resin 1 can be polymerized in the presence of both a TAM'-CN and TAM-H color former. In a typical 2 color experiment, 0.04% MGH (Malachite Green leucobase) and 0.005% BFCN (Basic Fuchsin leuconitrile) are included in Resin 1. The contrast ratios obtained are 4.4 at 570 nm and 0.3 at 630 rm. The polymer colors are blue and red/purple.

EXAMPLE 2

In accordance with another embodiment of the invention a stereolithography resin is polymerized in the presence of both a TAM'-CN and TAM-H color former wherein both colorformers are bleachable when exposed to high levels of actinic radiation. In a typical polychromic color experiment, 0.05% MGH and 0.0025% BFCN are included in Resin 2 containing cationically polymerizable epoxide(s) (60–90%), triarylsulfonium hexafluoroantimonate photoinitiator(s) (0.1–2%), acrylate esters (5–35%), free radical photoinitiator(s) (1–8%). The following absorbances and polymer color are obtained:

| Irr. Dose, mJ/cm² | Absorbance at 570 nm | Absorbance at 630 nm | Color |
|---|---|---|---|
| 250 | ~0.005 | 0.035 | Green/blue |
| 625 | 0.010 | 0.014 | purple |
| 1250 | ~0 | ~0 | yellowish |

Experimental
Samples are prepared as follows:
A 200 μm thin layer is drawn down on a glass slide. It is scanned with a He/Cd (325 nm) laser with a 1.5 mm diameter beam. The dose ranges from 40–800 mJ/cm² with a typical maximum dose being 600 mJ/cm². A low dose of 40 to 80 mJ/cm² is employed to polymerize the composition. A contrast ratio is measured at the maximum absorption with the absorbance at the high dose being ratioed to the absorbance at the lowest dose at the specified wavelength.

Having described the invention in detail, it will be apparent that modifications and variations are possible without departing from the scope of the invention defined in the appended claims.

What is claimed is:

1. A composition which can be selectively colored by exposure to actinic radiation which comprises an oxidizing agent, a first color former which yields a first dye cation upon exposure in the presence of the oxidizing agent, and a second color former which yields a second dye cation and a leaving group by heterolysis, wherein said first dye cation is bleached by further radiation in the presence of said second color former.

2. The composition of claim 1 wherein the oxidizing agent is a compound having a photoreduction potential less than said first color former.

3. The composition of claim 2 wherein said oxidizing agent is an onium salt.

4. The composition of claim 3 wherein said onium salt is a sulfonium salt or an iodonium salt.

5. The composition of claim 4 wherein said sulfonium salt is a triarylsulfonium salt.

6. The composition of claim 1 wherein said first dye cation is less stable than said second dye cation such that said first dye cation is preferentially bleached in the presence of said second dye cation.

7. The composition of claim 6 wherein said first dye cation includes fewer auxochromic groups in the ortho and para positions than said second dye cation.

8. The composition of claim 1 wherein said first color former and said second color former are present in an amount sufficient to provide a contrast ratio of at least 1.5.

9. The composition of claim 1 wherein the rate with which said first color former is oxidized is greater than the rate of heterolysis of said second color former.

10. The composition of claim 1 wherein said composition is a solid or a liquid.

11. The composition of claim 1 wherein said composition is sensitive to light having a wavelength less than 375 nm.

12. The composition of claim 1 wherein said composition can be selectively colored by exposure to radiation of different intensity.

13. The composition of claim 1 wherein said composition is selectively colored by exposure to radiation of different wavelength.

14. The composition of claim 1 further comprising a curable compound.

15. The composition of claim 14 wherein said curable compound is selected from the group consisting of epoxides, cyclic formals, cyclic acetals, cyclic ethers, cyclic esters, cyclic sulfides, alkyl monomers, vinyl monomers, vinyl ether functional prepolymers, melamine-formaldehyde prepolymers, phenol-formaldehyde prepolymers, cyclic organosiloxanes, actams, lactones, epoxy functional silicone oligomers, acrylates, methacrylates, vinyl ethers and mixtures thereof.

16. The composition of claim 15 wherein said curable compound is a mixture of an epoxide and one or more acrylates.

17. The composition of claim 1 wherein said first color former is selected from the group consisting of triarylmethane leuco dyes, diarylmethane leuco dyes and monoarylmethane leuco dyes.

18. The composition of claim 17 wherein said first color former is a triarylmethane leuco base.

19. The color former of claim 18 wherein said triarylmethane leucobase is Malachite Green leucobase.

20. The composition of claim 1 wherein said second color former is selected from the group consisting of triarylmethane leuco dyes, diarylmethane leuco dyes and monoarylmethane leuco dyes.

21. The composition of claim 20 wherein said triarylmethane leuco dye is a triarylmethane leuconitrile.

22. The composition of claim 21 wherein said triarylmethane leuconitrile is selected from the group consisting of tris(4-(N,N-dimethylamino)phenyl)cyanomethane (Crystal Violet Leuconitrile), bis(4-(N,N-dimethylamino)phenyl) (phenyl)cyanomethane (Malachite Green Leuconitrile), tris (4-aminophenyl)cyanomethane (Basic Fuchsin Leuconitrile), bis(4-(N,N-5-dimethylamino)phenyl) (pentafluorophenyl)cyanomethane, bis(4-(N,N-dimethylamino)phenyl)-(2-fluorophenyl)cyanomethane, bis (4-N,N-dimethylamino)phenyl)-(3-fluorophenyl) cyanomethane, bis(4-(N,N-dimethylamino)phenyl)-(2,6-difluorophenyl)cyanomethane, bis(3-(2-methylindyl)) (phenyl)cyanomethane, bis(4-aminophenyl)-(4-amino-3-methylphenyl)cyanomethane (Unsymmetric Basic Fuchsin Leuconitrile), tris[4-(N-triphenylmethyl)aminophenyl] cyanomethane (Protected Basic Fuchsin Leuconitrile), bis (4-(N,N-diethylamino)phenyl)(1-[4-(N-ethylamino) naphthyl])cyanomethane (Victoria Pure Blue Leuconitrile) and mixtures thereof.

23. The composition of claim 1 wherein said first color former is Malachite Green leucobase, said second color former is Basic Fuchsin leuconitrile and said oxidizing agent is a triarylsulfonium salt.

24. The composition of claim 1 wherein said second dye cation is bleached by exposure to a high dosage of actinic radiation.

25. A method comprising the steps of:
  a. providing a composition which comprises a first color former which yields a first dye cation upon exposure in the presence of an oxidizing agent and a second color former which yields a second dye cation and a leaving group by heterolysis,
  b. selectively exposing the composition to a low dosage of actinic radiation thereby forming a colored area of a first color, and
  c. selectively exposing the composition to an intermediate dosage of actinic radiation thereby forming a colored area of a second color.

26. The method of claim 25 including the additional step of:
  d. exposing selected areas of the composition to actinic radiation of a higher dosage thereby forming a colored area of a third color.

27. The method of claim 25 wherein said radiation is accomplished using at least one laser.

28. The method of claim 26 wherein said laser is a He/Cd (325 nm) laser.

* * * * *

UNITED STATES PATENT AND TRADEMARK OFFICE
CERTIFICATE OF CORRECTION

PATENT NO. : 6,309,797 B1
DATED : October 30, 2001
INVENTOR(S) : Oleg V. Grinevich et al.

It is certified that error appears in the above-identified patent and that said Letters Patent is hereby corrected as shown below:

Column 12, claim 22,
Line 5, The formula "N,N-5-dimethylamino" should be -- N,N-dimethylamino --.

Signed and Sealed this

Twelfth Day of March, 2002

Attest:

JAMES E. ROGAN
*Attesting Officer*   *Director of the United States Patent and Trademark Office*